United States Patent
Sprouse

(10) Patent No.: US 7,642,873 B2
(45) Date of Patent: *Jan. 5, 2010

(54) METHOD FOR ENABLING AN OSCILLATOR CIRCUIT USING TRANSITION DETECTION

(75) Inventor: Steven T. Sprouse, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 101 days.

This patent is subject to a terminal disclaimer.

(21) Appl. No.: 11/695,009

(22) Filed: Mar. 31, 2007

(65) Prior Publication Data

US 2008/0238564 A1 Oct. 2, 2008

(51) Int. Cl.
*H03B 1/00* (2006.01)
*H03B 5/30* (2006.01)

(52) U.S. Cl. .................. 331/173; 331/74; 331/158; 331/183; 327/299

(58) Field of Classification Search .............. 331/74, 331/172, 173, 117 R, 117 FE, 158, 160, 183, 331/116 R, 116 FE; 327/291, 299

See application file for complete search history.

(56) References Cited

U.S. PATENT DOCUMENTS

| | | | |
|---|---|---|---|
| 6,137,374 A * | 10/2000 | Merrill | 331/158 |
| 6,501,342 B2 * | 12/2002 | Marten | 331/173 |
| 6,556,094 B2 * | 4/2003 | Hasegawa et al. | 331/158 |
| 6,816,022 B2 * | 11/2004 | Hejdeman et al. | 331/74 |
| 2005/0030113 A1 * | 2/2005 | Ogawa et al. | 331/74 |
| 2008/0238565 A1 * | 10/2008 | Sprouse | 331/185 |

* cited by examiner

*Primary Examiner*—Robert Pascal
*Assistant Examiner*—Ryan J. Johnson
(74) *Attorney, Agent, or Firm*—Zagorin O'Brien Graham LLP

(57) ABSTRACT

An oscillator circuit may be used with controller circuits that are designed to operate with crystals, with no modifications to the pinout or firmware of the controller circuit. In some embodiments, the oscillator circuit includes an enable input that is responsive to low-amplitude transitions, which may be coupled to and driven by the crystal output signal of the controller circuit. When transitions are present on the crystal output signal, the oscillator circuit enables its clock output signal. When the controller circuit disables its crystal output signal, the oscillator circuit no longer detects transitions on the crystal output signal coupled to the oscillator circuit enable input, and disables the clock output signal.

18 Claims, 3 Drawing Sheets

METHOD FOR ENABLING AN OSCILLATOR CIRCUIT USING TRANSITION DETECTION

CROSS-REFERENCE TO RELATED APPLICATION(S)

This application is related to the following co-pending U.S. Application(s), each of which is incorporated by reference herein in its entirety:

U.S. application Ser. No. 11/695,010 entitled "Oscillator Circuit with Transition Detection Enable" by Steven T. Sprouse, filed on even date herewith.

BACKGROUND

1. Field of the Invention

The present invention relates to oscillator circuits, and particularly to oscillator circuits that may be enabled and disabled.

2. Description of the Related Art

Clock generation circuits generally use either a quartz crystal or an oscillator as a clock source. A quartz crystal is a passive, 2-pin component that requires a driver circuit to excite the crystal into resonance, and a receiver circuit to amplify the signal generated by the piezoelectric effect within the crystal, and to generate a useful clock signal. The driver and receiver circuits are frequently embedded within a controller circuit, such as a microprocessor, microcontroller, digital signal processor, network controller circuit, or virtually any digital circuit that utilizes a clock signal. When implemented in this manner, only the crystal is external to the controller circuit, and the remainder of the clock generator circuit is formed within the controller circuit.

Referring to FIG. 1, a clock generator 100 is depicted which utilizes a traditional crystal oscillator circuit. A controller circuit 102 includes a driver circuit 104 for driving a crystal output (i.e., XTAL_OUT) terminal 105, and further includes a receiver circuit 110 responsive to a crystal input (i.e., XTAL_IN) terminal 109. External to the controller circuit 102, a crystal 112 is connected between the XTAL_OUT terminal 105 and the XTAL_IN terminal 109. Such a crystal 112 may be incorporated within the package of the controller circuit 102, or may be located on a printed wiring board (PWB) adjacent to the controller circuit 102. One terminal 106 of the crystal 112 is connected to the XTAL_OUT terminal 105, and the other terminal 108 of the crystal 112 is connected to the XTAL_IN terminal 109.

Within the controller circuit 102, an inverting gain element 114 is provided to close the loop incorporating the crystal 112 and sustain oscillation of the circuit. The inverting gain element 114 may be, in some embodiments, as simple as a digital inverter whose input and output terminals are biased nominally at a mid-rail voltage, such as by a resistor (not shown) coupling the input of the inverter 114 to the output of the inverter 114. Of note, the signal level generated on the XTAL_OUT terminal 105 by the driver 104 is typically a low-amplitude signal, as it needs merely to excite the crystal to resonate. Also provided within the controller circuit 102 is additional buffering, such as is represented by buffer 116, to amplify the output of receiver 110 and generate an internal clock signal on node 118 with a drive strength appropriate for the internal load within the controller circuit 102. If the controller circuit 102 desires to disable the oscillator circuit, such as for a low power mode of operation, the driver circuit 104 may be disabled, thus breaking the feedback loop and preventing oscillations on XTAL_IN node 109.

An oscillator circuit (i.e., sometimes described as a "stand-alone" oscillator circuit) is typically an active, 4-pin component that requires connection to power and ground, and has a digital enable input, and a digital clock output. Referring now to FIG. 2, a clock generator 150 is depicted utilizing a traditional oscillator circuit 162. A controller circuit 152 includes a driver circuit 154 for driving a digital clock enable output signal (i.e., CLKEN) onto output terminal 156, and further includes a receiver circuit 160 responsive to a digital clock input signal (i.e., CLK_IN) conveyed on input terminal 158. External to the controller circuit 152, an oscillator circuit 162 is coupled to a power supply voltage VDD conveyed on node 164, and further coupled to ground reference voltage (i.e., GND) conveyed on node 166. Both the VDD and GND connections are usually provided directly by a printed wiring board upon which the oscillator circuit 162 is typically mounted. The oscillator circuit 162 has an enable input EN connected to node 156 to receive the CLKEN signal from the controller circuit 152, and further has a clock output CLK_OUT connected to node 158 to provide the clock signal to the controller circuit 152.

Within the controller circuit 152, the receiver circuit 160 is included to generate an internal clock signal on node 118 with drive strength appropriate for the internal load within the controller circuit 152. The receiver circuit 160 may include multiple stages of buffering, as dictated by considerations within the controller circuit 152. Of note, the signal level generated on the CLKEN output terminal 156 is typically a full-rail digital signal, as is typical for digital control signals. If the controller circuit 152 desires to disable the oscillator circuit 162, such as for a low power mode of operation, the driver circuit 154 is driven to generate an inactive level on the CLKEN signal (i.e., to de-assert the enable signal), which disables the generation of the CLK_OUT signal by the oscillator 162 and may also put the oscillator into a low power state.

SUMMARY

An improved oscillator circuit in accordance with the invention may be used with controller circuits that are designed to operate with crystals, with no modifications to the pinout or firmware of the controller circuit. The improved oscillator circuit includes an enable input that is responsive to low-amplitude transitions, which enable input may be coupled to the crystal output terminal of the controller circuit. When transitions are present in the crystal output signal, the oscillator circuit enables its clock output signal. When the controller circuit disables its crystal output signal, the oscillator circuit no longer detects transitions in the crystal output signal coupled to the oscillator circuit enable input, and disables the clock output signal.

In one aspect the invention provides a method for controlling an oscillator circuit. In certain embodiments, the method includes enabling an oscillator output responsive to a signal coupled to an oscillator enable input and, once enabled, for so long as transitions are present in the signal coupled to the enable input, and disabling the oscillator output when such transitions are no longer present.

In some embodiments, the oscillator output, if disabled, is enabled by the presence of transitions in the signal coupled to the enable input, or by a specific momentary voltage level of the signal coupled to the enable input. In some embodiments, the oscillator output, if disabled, is enabled by a sufficiently high or low voltage of the signal coupled to the enable input, and also remains enabled so long as the sufficiently high or low voltage is maintained.

In another aspect the invention provides a method for making a product. In some embodiments, the method includes: forming a first voltage supply node for a first circuit; forming a second voltage supply node for the first circuit; forming an oscillator output node for the first circuit; forming an enable input node for the first circuit; forming an oscillator circuit coupled to the first and second voltage supply nodes, said oscillator circuit having an output coupled to the oscillator output node; and forming an enable circuit having an input coupled to the enable input node and having an output coupled to the oscillator circuit, said enable circuit comprising a transition detector circuit for detecting whether transitions are present in a signal coupled to the enable input node.

In some embodiments, the method includes: coupling an enable input node of an oscillator circuit to a driver circuit output node of a second circuit, said driver circuit providing a signal on its output node suitable for direct connection to a first terminal of a crystal; and coupling an oscillator output node of the oscillator circuit to a receiver circuit input node of the second circuit, said receiver circuit suitable for direct connection to a second terminal of the crystal.

The invention in several aspects is particularly suitable for implementation within an integrated circuit, for methods for operating such circuits, for systems incorporating such circuits, and for computer readable media encodings of such circuits, all as described herein in greater detail and as set forth in the appended claims. The inventive aspects described herein are contemplated to be used alone or in combination.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
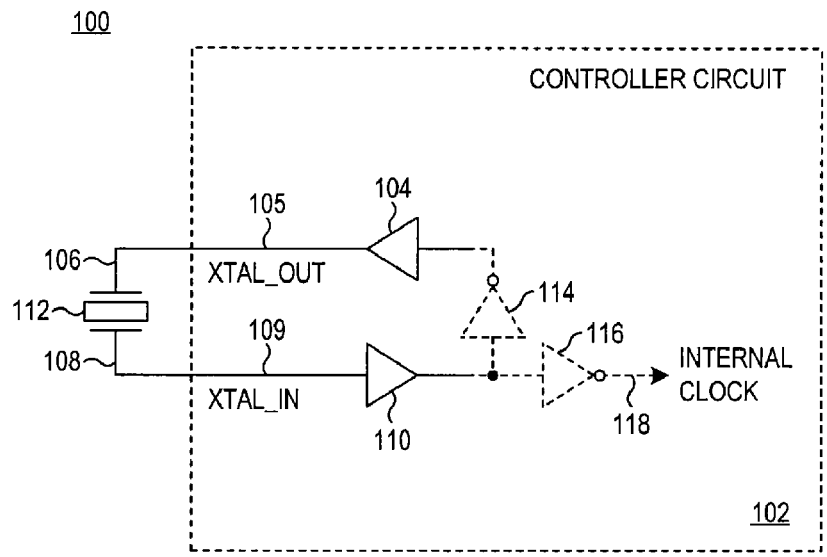
FIG. 1 is a block diagram of a prior art clock generation circuit using a crystal oscillator circuit.
Figure 2:
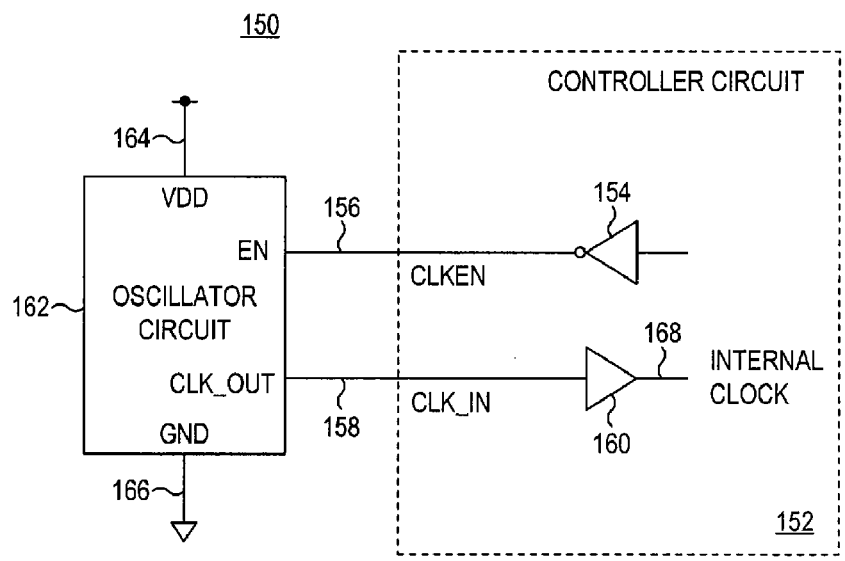
FIG. 2 is a block diagram of a prior art clock generation circuit using an oscillator circuit.
Figure 3:
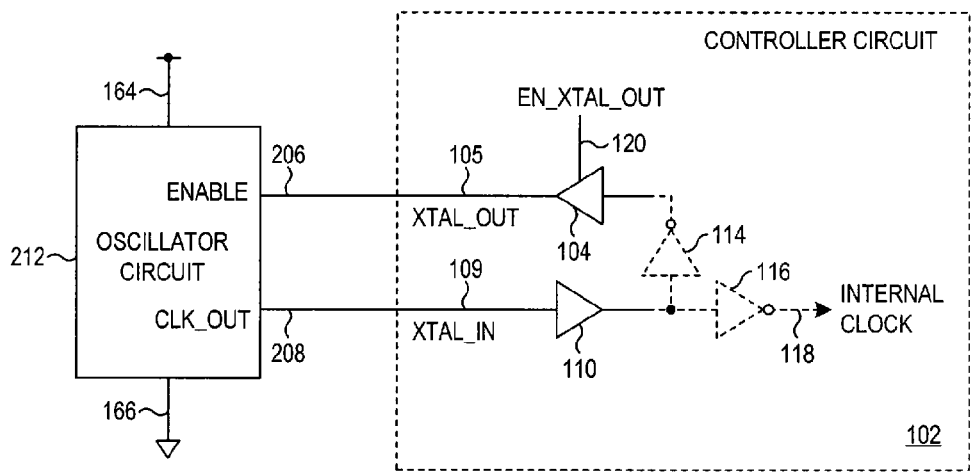
FIG. 3 is a block diagram of a clock generation circuit using an oscillator circuit in accordance with certain embodiments of the present invention.

Referring now to FIG. 3, a clock generator 200 is depicted which utilizes a controller circuit 102, like that depicted in FIG. 1, which is configured to drive an external crystal, but which instead is coupled to an oscillator circuit 212. The controller circuit 102 includes a driver circuit 104 whose output is coupled to the XTAL_OUT terminal 105, and further includes a receiver circuit 110 whose input is coupled to the XTAL_IN terminal 109. The oscillator circuit 212, which is coupled to the VDD supply 164 and to the GND node 166, has an enable input ENABLE (node 206) connected to the XTAL_OUT terminal 105 of the controller circuit 102, and farther has a clock output CLK_OUT (node 208) coupled to the XTAL_IN terminal 109 of the controller circuit 102.

In operation, as long as transitions are detected on the ENABLE input 206, the oscillator output 208 remains enabled, and provides the clock signal to the XTAL_IN terminal 109 of the controller circuit 102. If the controller circuit 102 desires to disable the oscillator circuit 212, the driver circuit 104 may be disabled by de-asserting the EN_XTAL_OUT signal conveyed on node 120. In some controller circuits, disabling the driver circuit 104 may drive the XTAL_OUT signal to a particular voltage level, while in other controllers, this may "three-state" the output of the driver circuit 104, thus placing the XTAL_OUT node in a high impedance state. Either outcome prevents further transitions on the XTAL_OUT signal. When the oscillator circuit 212 detects that transitions are no longer occurring on its ENABLE input 206, the CLK_OUT oscillator output 208 is disabled.

The ENABLE input 206 is preferably responsive to low-amplitude transitions, such as are typically generated on the XTAL_OUT crystal output signal of the controller circuit 102. Such an ENABLE input may also be responsive to full-rail transitions. In certain embodiments, the oscillator circuit 212 may include a bias network coupled to the ENABLE input 206, to establish a known state on the ENABLE input 206 when the controller circuit 102 disables the XTAL_OUT driver 104. For example, a bias network may include weak pull-up and/or pull-down resistors for establishing a known first state (i.e., a particular voltage) when the output driver 104 is placed in a high impedance state. The controller circuit 102 may include a coarse internal timing clock to provide for rudimentary clock functionality even in the absence of a high-accuracy external clock signal. Using such an internal clock, firmware in the controller circuit 102 can repeatedly enable the driver 104, which drives the XTAL_OUT signal (i.e., the ENABLE signal) to a second state, and then disable the driver 104 to allow the ENABLE signal to revert back to the first known state. This causes a series of transitions to be generated as the XTAL_OUT is repeatedly "toggled" by the firmware, which transitions may be detected to enable the oscillator circuit 212. Such a bias network may alternatively be provided external to both the controller circuit 102 and the oscillator circuit 212, such as individual resistors mounted directly on a printed wiring board. Alternatively, once enabled, the oscillator circuit 212 may remain enabled by transitions generated by operation of the receiver circuit 110, the inverting gain element 114, and the driver circuit 104, to receiving an enabled clock signal on the XTAL_IN terminal.

Figure 4:
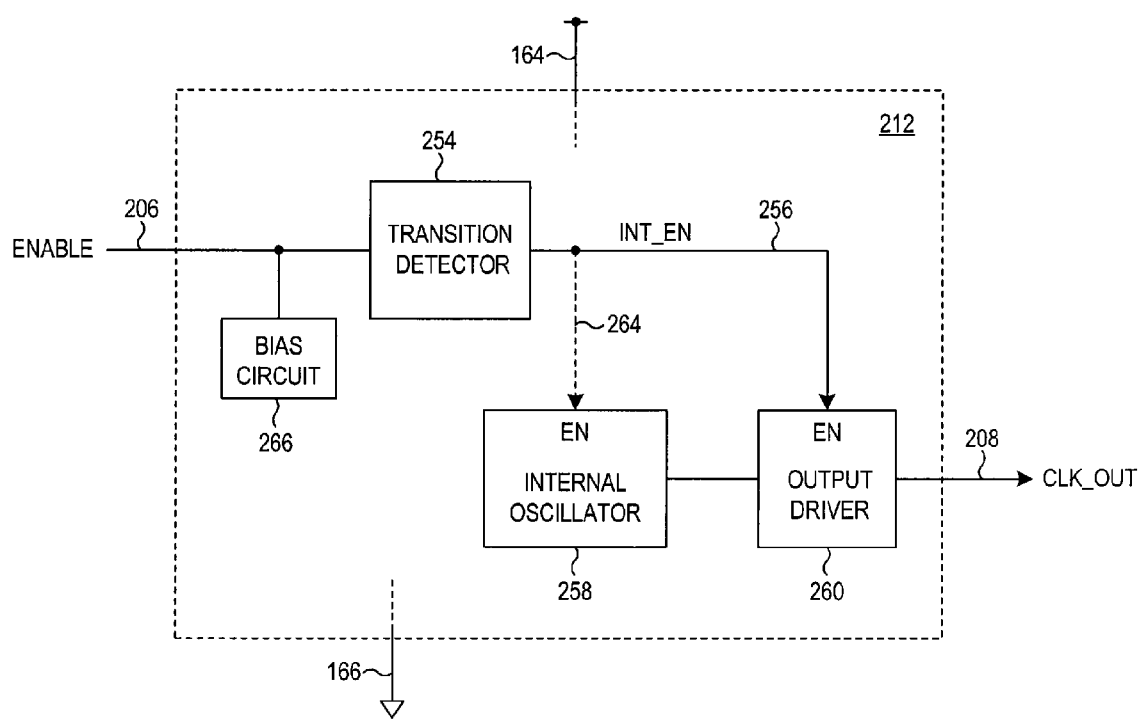
FIG. 4 is a block diagram of an oscillator circuit in accordance with certain embodiments of the present invention.

There are many possible implementations of such an oscillator circuit 212. One such implementation is depicted in FIG. 4, which includes a transition detector 254 having an input coupled to the ENABLE input 206, and having an output for generating an internal enable INT_EN signal on node 256. The oscillator circuit 212 also includes an internal oscillator 258, and a clock output driver 260 for driving a clock signal onto the CLK_OUT node 208. The INT_EN signal 256 is coupled to the clock output driver 260 and enables or disables the CLK_OUT signal depending upon whether transitions are detected on the ENABLE input 206. Optionally, the INT_EN signal 256 may also be coupled (by way of connection 264) to the internal oscillator 258, such as to provide for a low power mode of the internal oscillator 258 when the oscillator circuit 212 is disabled. A bias network 266 is coupled to the ENABLE input 206 to provide for a known state on the ENABLE input 206 when a high-impedance driver (or even no driver) is coupled to the ENABLE input 206, as described above. Such a bias network may include a weak pull-up resistor, a weak pull-down resistor, both a weak pull-up and a weak pull-down resistor, or any other suitable circuit structure for establishing a useful known state. Such useful state may be advantageously chosen in relation to the specific threshold levels of the transition detector 254.

Colloquially, the ENABLE input 206 may be viewed as "frequency sensitive analog input" since the transitions detected are typically low amplitude signals having a magnitude much less than a full rail-to-rail signal (e.g., a VDD-to-GND signal). When such transitions are present, the INT_EN signal is active to enable the oscillator circuit 212, and when no transitions are present, the INT_EN signal is inactive to disable the oscillator circuit 212. However, no specific frequency is implied by the colloquial phrase, nor even any requirement that such transitions are periodic, although such is certainly likely to be encountered in ordinary usage. This enable input functionality is in contrast to a traditional oscillator circuit, whose enable input is a level sensitive digital input that responds to a full logic level signal. For example, a logic "1" corresponding to the VDD voltage may be asserted to enable the oscillator, while a logic "0" corresponding to the GND voltage may be asserted to disable the oscillator.

Figure 5:
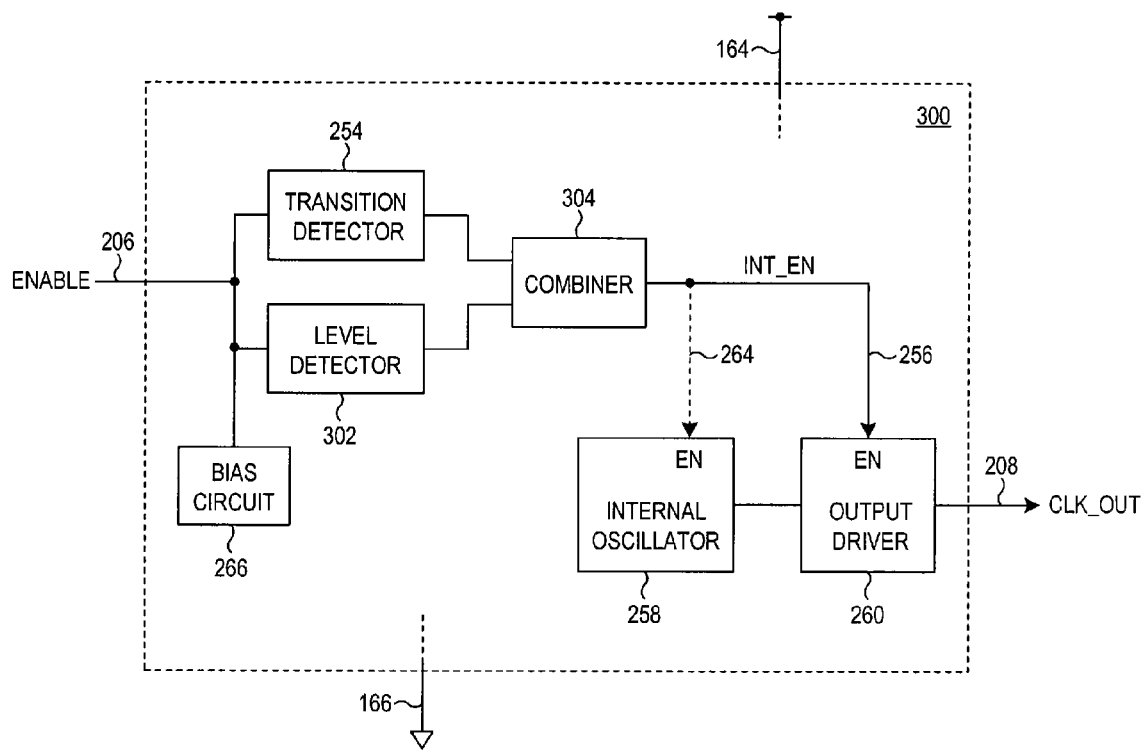
FIG. 5 is a block diagram of an oscillator circuit in accordance with certain embodiments of the present invention.

Referring now to FIG. 5, an oscillator circuit 300 is depicted which includes a level detector 302 having an input coupled to the ENABLE input 206, in addition to the transition detector 254 which is also coupled to the ENABLE input 206. The respective outputs from both the transition detector 254 and the level detector 302 are coupled to a combiner circuit 304, whose output is coupled to the internal enable INT_EN signal on node 256. In this fashion, the oscillator circuit 300 may be responsive to both low-amplitude transitions signal, and/or a level-sensitive signal, conveyed to the ENABLE input node 206.

The combiner circuit 304 may be implemented to accomplish any of a variety of possible functionality. For example, the oscillator circuit 300, if disabled, may be initially enabled when the level detector 302 detects a specific momentary voltage level of the signal coupled to the ENABLE input 206, and then may remain enabled for as long as the transition detector 254 detects continuing transitions in the signal coupled to the ENABLE input 206, and then disabled when transitions are no longer detected. Such a specific momentary voltage level may represent the first of a series of transitions (e.g., the "toggling" of the XTAL_OUT terminal by firmware, as described above), or may represent a logic level driven onto the enable signal for a time (e.g., having a voltage level substantially equal to the high-level or the low-level of the CLK_OUT signal, which may be a VDD-to-GND "rail-to-rail" signal), or may represent any specific analog voltage which is detected by the level detector 302. Each of these examples represents but one of many examples of enabling an oscillator output responsive to a signal coupled to an oscillator enable input and, once enabled, for so long as transitions are present in the signal coupled to the enable input, and disabling the oscillator output when such transitions are no longer present. The circuit in FIG. 4, which is enabled and disabled by the presence or absence of transitions, also represents such functionality.

In some embodiments, the oscillator circuit 300, if disabled, may be initially enabled when the level detector 302 detects a specific voltage level in the signal coupled to the ENABLE input 206, and then may also remain enabled for as long as the specific voltage level remains, and then disabled when the specific voltage level is no longer present. Such a capability would allow the oscillator circuit 300 to be back-compatible for use with a traditional level-sensitive "rail-to-rail" enable signal, yet also function with a controller circuit that is designed to be coupled to an external crystal.

The transition detector 254 is contemplated to preferably detect transitions having an amplitude that is much less than a full-rail-to-rail signal. It may be viewed casually as a "pulse detector", although such terminology might be viewed as implying a more precisely formed signal waveform, of greater amplitude, than is intended. Moreover, while such transitions may be periodic, such is not necessarily required. However, in certain embodiments the transition detector 254 may be configured to recognize periodic transitions representing a frequency within a desired range (e.g., an order of magnitude) of the frequency of the internal oscillator 258. In other embodiments, one or two quick transitions in the ENABLE signal may serve to enable the oscillator circuit 300 for a considerably long time, to ensure that the clock signal remains operational. In other words, the transition detector 254 may not disable the oscillator circuit for a considerable time after the most recent transition is detected. Nevertheless, the power savings achievable by disabling the CLK_OUT signal will likely not be diminished too greatly by such a delay.

In a general sense, the internal oscillator 258 and its output driver 260 may be viewed collectively as an oscillator circuit having an oscillator output conveyed on node 208. In addition, the transition detector 254, the level detector 302, and the combiner circuit 304 may be viewed collectively as an enable circuit.

Figure 6:
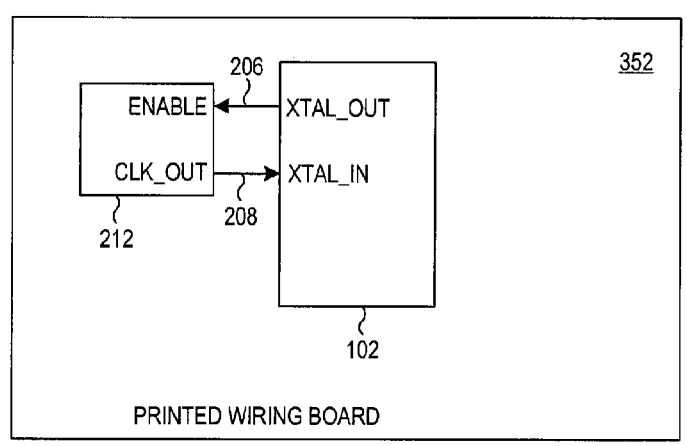
FIG. 6 is a block diagram depicting an oscillator circuit and a controller circuit mounted on a printed wiring board.

Referring now to FIG. 6, a printed wiring board 352 is depicted, upon which a controller circuit 102 and an oscillator circuit 212 are mounted. Additional circuits (not shown) may also be mounted on the printed wiring board 352.

As used herein, a "clock" signal is not to be understood in merely a narrow sense, but is contemplated to represent a periodic signal, usually of high timing accuracy, for providing a timing reference signal.

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As used herein, a voltage supply node may be coupled to an externally generated source of voltage, or to an internally generated voltage by a circuit such as a voltage divider, a charge pump or other boosting circuit, a DC-DC converter circuit, or any other circuit for generating a source of voltage usable by other circuitry. Such nodes may also be described as power supply nodes. The ground reference node (i.e., VSS, "ground") may also be described as voltage supply node.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While circuits and physical structures are generally presumed, it is well recognized that in modern semiconductor and electronic system design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/ or may include any other encoding from which the circuit may be represented or communicated.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

What is claimed is:

1. A method for controlling an oscillator circuit, said method comprising:
    enabling an oscillator output when a first signal coupled to an oscillator enable input includes transitions of a first amplitude and when the first signal comprises a substantially constant voltage level outside a voltage range corresponding to the first amplitude; and
    disabling the oscillator output when the first signal neither comprises the substantially constant voltage level nor includes transitions of the first amplitude.

2. The method as recited in claim 1 wherein said substantially constant voltage level comprises a voltage level substantially equal to either the high-level or the low-level of the oscillator output signal.

3. The method as recited in claim 1 further comprising biasing the oscillator enable input, in the absence of a signal coupled thereto, to a known state.

4. The method as recited in claim 1 wherein said transitions of the first amplitude in the first signal comprise periodic transitions having a magnitude substantially less than the amplitude of the oscillator output signal.

5. The method as recited in claim 4 wherein the oscillator output signal is a full rail signal.

6. The method as recited in claim 1 wherein said transitions in the first signal represent a frequency that is within an order of magnitude of the frequency of the oscillator output signal when enabled.

7. The method as recited in claim 1 wherein the oscillator circuit assumes a low-power state when the oscillator output is disabled.

8. The method as recited in claim 7 wherein:
    said transitions of the first amplitude in the first signal comprise periodic transitions having a magnitude substantially less than the amplitude of the oscillator output signal.

9. A method for making a product, said method comprising:
    forming a first voltage supply node for a first circuit;
    forming a second voltage supply node for the first circuit;
    forming an oscillator output node for the first circuit;
    forming an enable input node for the first circuit;
    forming an oscillator circuit coupled to the first and second voltage supply nodes, said oscillator circuit having an output coupled to the oscillator output node; and
    forming an enable circuit having an input coupled to the enable input node and having an output coupled to the oscillator circuit, said enable circuit comprising a transition detector circuit for detecting whether transitions are present in a signal coupled to the enable input node, and farther comprising a level detector circuit for detecting a specific voltage level of the signal coupled to the enable input node.

10. The method as recited in claim 9 further comprising:
coupling the enable input node to a driver circuit output node of a second circuit, said driver circuit providing a signal on its output node suitable for direct connection to a first terminal of a crystal; and
coupling the oscillator output node to a receiver circuit input node of the second circuit, said receiver circuit suitable for direct connection to a second terminal of the crystal.

11. The method as recited in claim 10 further comprising forming a bias circuit coupled to the enable input node, said bias circuit for biasing the oscillator enable input, in the absence of a signal coupled thereto, to a known state.

12. The method as recited in claim 10 further comprising attaching the first and second circuits to a printed wiring board.

13. The method as recited in claim 9 wherein:
the transition detector circuit is configured to detect transitions of a first amplitude; and
the level detector circuit is configured to detect a specific voltage level outside a voltage range corresponding to the first amplitude.

14. The method as recited in claim 13 wherein:
the specific voltage level comprises a voltage level substantially equal to either the high-level or the low-level of the oscillator output signal.

15. The method as recited in claim 13 wherein said transitions of a first amplitude in the signal coupled to the enable input comprise periodic transitions having a magnitude substantially less than the amplitude of the oscillator output signal.

16. A method for making a product, said method comprising:
coupling an enable input node of an oscillator circuit to a driver circuit output node of a second circuit, said driver circuit providing a signal on its output node suitable for direct connection to a first terminal of a crystal; and
coupling an oscillator output node of the oscillator circuit to a receiver circuit input node of the second circuit, said receiver circuit suitable for direct connection to a second terminal of the crystal;
wherein the oscillator circuit includes an enable circuit which comprises a transition detector circuit for detecting whether transitions are present in a signal coupled to the enable input node, and which further comprises a level detector circuit for detecting a specific voltage level of the signal coupled to the enable input node.

17. The method as recited in claim 16 further comprising coupling a bias circuit to the enable input node, said bias circuit for biasing the oscillator enable input, in the absence of a signal coupled thereto, to a known state.

18. The method as recited in claim 16 further comprising attaching the oscillator circuit and the second circuit to a printed wiring board.

* * * * *

UNITED STATES PATENT AND TRADEMARK OFFICE
CERTIFICATE OF CORRECTION

PATENT NO. : 7,642,873 B2  Page 1 of 1
APPLICATION NO. : 11/695009
DATED : January 5, 2010
INVENTOR(S) : Steven T. Sprouse It is certified that error appears in the above-identified patent and that said Letters Patent is hereby corrected as shown below:

Col. 4, line 7, please replace "farther" with --further--
Col. 9, line 1, please replace "and farther" with --and further--

Signed and Sealed this

Tenth Day of August, 2010

David J. Kappos
*Director of the United States Patent and Trademark Office*